(12) United States Patent
Chen

(10) Patent No.: US 7,193,285 B2
(45) Date of Patent: Mar. 20, 2007

(54) TILTED ARRAY GEOMETRY FOR IMPROVED MRAM SWITCHING

(75) Inventor: Guoqing Chen, Shanghai (CN)

(73) Assignee: Micron Technology, Inc., Boise, ID (US)

(*) Notice: Subject to any disclaimer, the term of this patent is extended or adjusted under 35 U.S.C. 154(b) by 110 days.

(21) Appl. No.: 11/179,029

(22) Filed: Jul. 11, 2005

(65) Prior Publication Data

US 2007/0007608 A1 Jan. 11, 2007

Related U.S. Application Data

(63) Continuation of application No. 10/371,986, filed on Feb. 21, 2003, now Pat. No. 6,917,087.

(51) Int. Cl.
*H01L 29/82* (2006.01)
*H01L 43/00* (2006.01)

(52) U.S. Cl. ............... 257/421; 257/E21.665; 365/173

(58) Field of Classification Search ........... 257/421, 257/E21.665; 365/173
See application file for complete search history.

(56) References Cited

U.S. PATENT DOCUMENTS

| 5,841,611 | A | 11/1998 | Sakakima et al. |
| 5,892,708 | A | 4/1999 | Pohm |
| 6,005,798 | A | 12/1999 | Sakakima et al. |
| 6,005,800 | A | 12/1999 | Koch et al. |
| 6,104,633 | A | 8/2000 | Abraham et al. |
| 6,111,782 | A | 8/2000 | Sakakima et al. |
| 6,134,139 | A | 10/2000 | Bhattacharyya et al. |
| 6,236,590 | B1 | 5/2001 | Bhattacharyya et al. |
| 6,368,878 | B1 | 4/2002 | Abraham et al. |
| 6,424,561 | B1 | 7/2002 | Li et al. |
| 6,424,564 | B2 | 7/2002 | Li et al. |
| 6,483,741 | B1 | 11/2002 | Iwasaki et al. |
| 6,522,574 | B2 | 2/2003 | Li et al. |

(Continued)

FOREIGN PATENT DOCUMENTS

EP 0681338 A1 11/1995

(Continued)

OTHER PUBLICATIONS

Pohm et al.; "Experimental and Analytical Properties of 0.2 Micron Wide, Multi-Layer, GMR, Memory Elements"; IEEE Transactions on Magnetics, vol. 32, No. 5; Sep. 5, 1996.

*Primary Examiner*—Andy Huynh
*Assistant Examiner*—Earl Taylor
(74) *Attorney, Agent, or Firm*—Knobbe, Martens, Olson & Bear LLP

(57) ABSTRACT

An array of conductive lines for MRAM circuits wherein at least one set of mutually parallel conductive traces is tilted with respect to being perpendicular with a corresponding set of mutually parallel conductive traces wherein individual conductive traces within the sets intersect adjacent individual MRAM cells and wherein the tilting of the at least one set of conductive traces acts to induce both a vertical and horizontal component of a magnetic field such that the net vector addition of magnetic fields induced by the sets of conductive traces is greater than the untilted or perpendicular configuration so as to induce a greater net magnetic field to effect more reliable switching of the underlying MRAM cells. The tilted array also enables reducing the current supplied by the conductive traces while maintaining a comparable net magnetic field to the untilted configuration.

20 Claims, 4 Drawing Sheets

| U.S. PATENT DOCUMENTS | | | | FOREIGN PATENT DOCUMENTS | | |
|---|---|---|---|---|---|---|
| 6,673,675 B2 | 1/2004 | Yates et al. | | EP | 0936623 A2 | 8/1999 |
| 6,683,338 B2 | 1/2004 | Chen | | EP | 1061592 A2 | 12/2000 |

TILTED ARRAY GEOMETRY FOR IMPROVED MRAM SWITCHING

RELATED APPLICATIONS

This application is a continuation of U.S. application Ser. No. 10/371,986 filed Feb. 21, 2003 now issued Jul. 12, 2005 as U.S. Pat. No. 6,917,087, which is hereby incorporated in its entirety by reference herein.

BACKGROUND OF THE INVENTION

1. Field of the Invention

The invention relates to the field of magnetoresistive random access memory (MRAM) and, in particular, to a tilted array geometry for improved MRAM switching.

2. Description of the Related Art

Traditional electronic memory media have included magnetic core memory, magnetic tapes, and semiconductor based memory. Semiconductor based memory includes such types as random access memory (RAM), read-only-memory (ROM), and flash memory. Semiconductor RAM offers the advantage of fast access, however, it suffers the liability of volatility. The transistors and capacitors comprising semiconductor RAM depend on their conductive or charge state, respectively, to store digital data. Accordingly, the transistors and capacitors must be powered to maintain data stored therein and periodically refreshed. If the circuit loses power even briefly, the information is lost. Thus, semiconductor RAM is referred to as volatile memory.

Semiconductor based memories also suffer from a susceptibility to radiation corruption. Incident radiation can create stray carriers and resultant currents in the semiconductor devices and corrupt information stored therein. Radiation exposure occurs routinely in terrestrial unshielded applications, however, the level of radiation can be several orders of magnitude greater in space. Space vehicles and military equipment are, therefore, typically provided with specially hardened and shielded electronics. However, the shielding and hardening add substantial cost and complexity to such systems.

MRAM is a developing technology that offers the advantages of non-volatility, radiation hardness, and high density. MRAM employs the spin property of electrons and a physical property known as giant magnetoresistance (GMR). A spinning charged body, such as an electron, induces a magnetic field. In the presence of an external magnetic field, the spin of the electron is in one of two directions, either "up spin" or aligned with the magnetic field, or "down spin" or anti-parallel to the magnetic field. Thus, the magnetic field of the electron is either directed "up" or "down" or parallel or anti-parallel with the external magnetic field.

The electrons in most materials are randomly oriented with an electron of any particular orientation being compensated for by an oppositely oriented electron so that the material has no bulk magnetization. However, certain metals, such as Co, Fe, and Ni, as well as certain compounds, can exhibit a bulk magnetization. The electrons in such materials gain energy when they are aligned together and, when they do so, the material retains and exhibits a gross, bulk magnetization. Such materials are termed ferromagnetic.

When thin layers ($10^0$–$10^1$ atoms thick) of certain ferromagnetic and non-ferromagnetic metals (for example alternating layers of Fe and Cr or Co and Cu) are layered in particular ways, they exhibit variable electrical conductivity depending on the magnetization state of the layers. In particular, if the layers are magnetized in the same direction, the layered material exhibits low electrical resistivity whereas if adjacent layers are magnetized in opposite directions, the layered material exhibits a high electrical resistivity. The up or down spin of the electrons are believed to interact with the bulk magnetization of the layered materials to either facilitate or impede the flow of the electrons under an electric field. When the layers are aligned in the same direction, either the "up" or "down" electrons can travel through the material with minimal scattering and, thus, with low resistivity. The complementary type of electrons will be scattered and experience a higher resistivity. However, in the case where adjacent layers are oppositely magnetized, both "up" and "down" electrons will be scattered by one orientation of layers and, thus, all electrons will be scattered with none seeing an advantageously oriented material.

MRAM employs this variable resistivity to define logic states wherein the high and low resistivity states represent a logical "1" or "0". Individual cells of layered GMR materials are magnetized or not to form a binary logic state and thus a memory circuit element.

MRAM circuits typically employ an array of conductive lines arranged in an orthogonal geometry as illustrated in FIG. 1. The row and column lines are positioned to intersect adjacent each MRAM cell. When an electrical current is supplied to one of the lines, a magnetic field is induced according to well-understood electromagnetic principles. A row current $I_{row}$ generates a transverse magnetic field $H_y$ and a column current $I_{col}$ generates a longitudinal magnetic field $H_x$ through the MRAM cells. The induced magnetic field $H_y$ or $H_x$ impinges on all cells in the corresponding row or column and partially magnetizes those cells. The magnitude of the current in the row and column lines as well as the dimensions and materials of the MRAM cells are chosen such that both a row and a column current is required for the cell to exceed a write threshold in order to switch logic states. In particular, a row or column current by itself should be insufficient to switch a cell, however, applying both a row and a column current will switch the cell at the intersection of the two lines.

FIG. 2 illustrates the switching/no-switching regions of operation for an MRAM cell array. The half-select points are the condition where exclusively a row or a column current is applied. The half-select condition should not switch the cells in the corresponding row or column unless a complementary column or row current is also applied to a particular cell. The full-select point represents a cell where both a row and a column current are applied. The dashed line indicates the condition of equal row and column fields and orthogonal row and current lines. The curve illustrates that the row and column current can be independently varied and the boundary between switching and non-switching conditions. The vector addition of $H_x$ and $H_y$ must result in a total H magnitude to the right of the curve to reliably switch the cell.

This switching protocol places severe requirements on the process tolerances as well as the line currents. An excessive row or column current can inadvertently switch cells in the corresponding row or column that are not intended to be switched. Conversely, an inadequate row or column current can fail to switch a cell when desired. In a similar manner, if the materials or dimensions of a cell vary excessively, the cell can be unintentionally switched or not-switched. These considerations place design constraints on the process as well as present obstacles to scaling the devices for increased circuit density.

Another design goal of electronic circuits in general, including MRAM technologies, is to reduce the drive current for switching. Reducing the drive current reduces the power consumption of the circuit, and incurs less resistive heating within the circuit, and can reduce the size and weight of power supplies. Particularly as the conductive line widths are reduced through scaling, the need to minimize resistive heating becomes acute.

From the foregoing, it can be appreciated that there is a need for an MRAM array geometry that offers improved switching. There is also a need for an array geometry that offers increased fault tolerance and reduced current switching requirements.

SUMMARY OF THE INVENTION

The aforementioned needs are satisfied by the invention, which, in one aspect, is an MRAM array comprising a substrate, a plurality of MRAM devices distributed over the substrate, a first set of parallel conductors that are positioned adjacent a first side of the plurality of MRAM devices, and a second set of parallel conductors that are positioned adjacent a second side of the plurality of MRAM devices wherein the first set and second set of parallel conductors intersect in at least one plane at a plurality of locations adjacent the plurality of MRAM devices such that at the plurality of locations, each of the first and second set of conductors intersect at an angle offset from perpendicular wherein the angle is selected to increase the net magnetic field sensed by one of the plurality of MRAM devices when current is simultaneously applied to a corresponding one of the first set and the second set of conductors.

In one aspect, the first set of parallel conductors comprise a column address array and the second set of parallel conductors comprise a row address array. The first set of parallel conductors may be positioned in the substrate underneath the plurality of MRAM devices and the second set of parallel conductors may be positioned over the plurality of MRAM elements such that the plurality of MRAM elements are interposed between the first and second plurality of conductors.

In another aspect, the plurality of MRAM devices have a first lateral dimension defining a major axis and a second lateral dimension defining a minor axis wherein the first lateral dimension is greater than the second lateral dimension. The first set of parallel conductors may be positioned with respect to the plurality of MRAM devices such that the direction of the first set of parallel conductors is offset from the major axis by the angle. In certain aspects, the angle is between approximately 0 degrees and 45 degrees and the plurality of MRAM devices include a pinned layer a sense layer and a tunnel layer interposed between pinned and sense layer.

In a further aspect, the invention is a memory device comprising a memory cell, wherein the memory cell is configured to have at least a first and a second magnetic state and to switch therebetween in response to the application of an external magnetic field and wherein the memory cell has a first dimension defining a first axis and a second dimension, less than the first dimension, defining a second axis, a first conductor positioned adjacent the memory cell, and a second conductor positioned adjacent the memory cell, wherein the memory cell changes between the first and second magnetic states when current is simultaneously applied in both the first and second conductors and wherein the first and second conductors are positioned with respect to each other so as to intersect in at least one plane adjacent the memory cell and wherein the first conductor is positioned so as to be directed at an angle with respect to the first axis of the memory cell that is selected to enhance the strength of the magnetic field sensed by the memory cell when current is applied to the first and second set of conductors to thereby enhance the reliability of the magnetic cell switching as a result of the applied external magnetic field.

In certain aspects, the memory cell comprises an MRAM cell and the MRAM device may include a pinned layer, a sense layer, and a tunnel layer interposed therebetween. In particular aspects, the MRAM device is interposed between the first and second conductor and the memory device further comprises a substrate wherein the first conductor is formed in the substrate and wherein the MRAM device is formed on a surface of the substrate adjacent the first conductor. The memory device may also include an interlayer dielectric layer formed adjacent the MRAM device wherein the second conductor is positioned on the interlayer dielectric layer so as to be positioned adjacent an upper surface of the MRAM device. The angle is between 0 and 45 degrees in particular aspects of the invention.

In yet another aspect, the invention is a memory device comprising a substrate, a plurality of MRAM devices formed on the substrate wherein each of the plurality of MRAM devices have a major axis and are changeable between a first and second memory state as a result of an applied magnetic field, a first set of conductors positioned adjacent the plurality of MRAM devices, and a second set of conductors positioned adjacent the plurality of MRAM devices wherein the MRAM devices are configured to only change between the first and second memory state by a simultaneous current flow through a corresponding first and second conductor and wherein the simultaneous current flow through the conductors creates two orthogonal components of the magnetic field and wherein the plurality of second conductors are oriented with respect to the plurality of MRAM devices such that one of the orthogonal components is increased while the second component is decreased such that the overall net magnetic field applied to the corresponding MRAM device is increased in the direction of the major axis thereby improving the reliability of switching the MRAM device between the first and second memory state.

In certain aspects, the first plurality of conductors are positioned in the substrate underneath the plurality of MRAM devices and the second plurality of conductors are positioned over the plurality of MRAM elements such that the plurality of MRAM elements are interposed between the first and second plurality of conductors. The first plurality of conductors may be positioned with respect to the plurality of MRAM devices such that the direction of the first plurality of conductors is offset from the major axis by an acute angle and the acute angle may be between approximately 0 degrees and 45 degrees.

These and other objects and advantages of the present invention will become more fully apparent from the following description taken in conjunction with the accompanying drawings.

DETAILED DESCRIPTION OF THE PREFERRED EMBODIMENT

Figure 1:
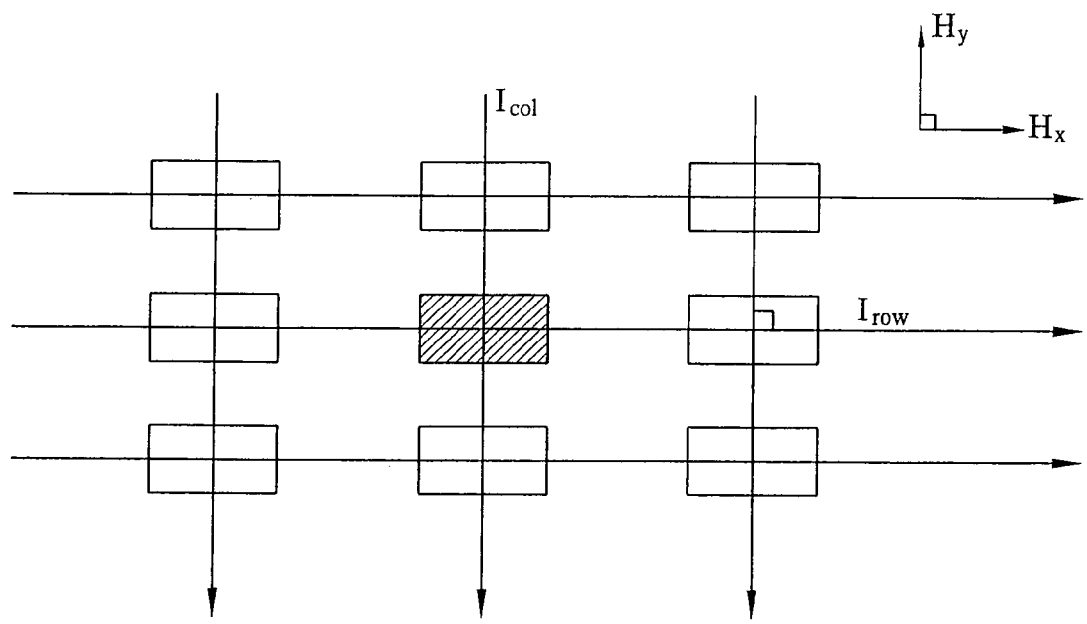
FIG. 1 illustrates a typical prior art MRAM array geometry.
Figure 2:
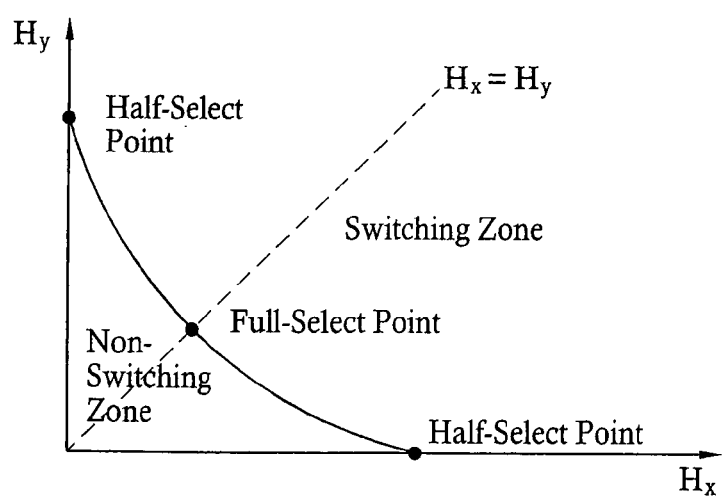
FIG. 2 is a graph showing the non-switching and switching zones of operation of a conventional MRAM cell.
Figure 3:
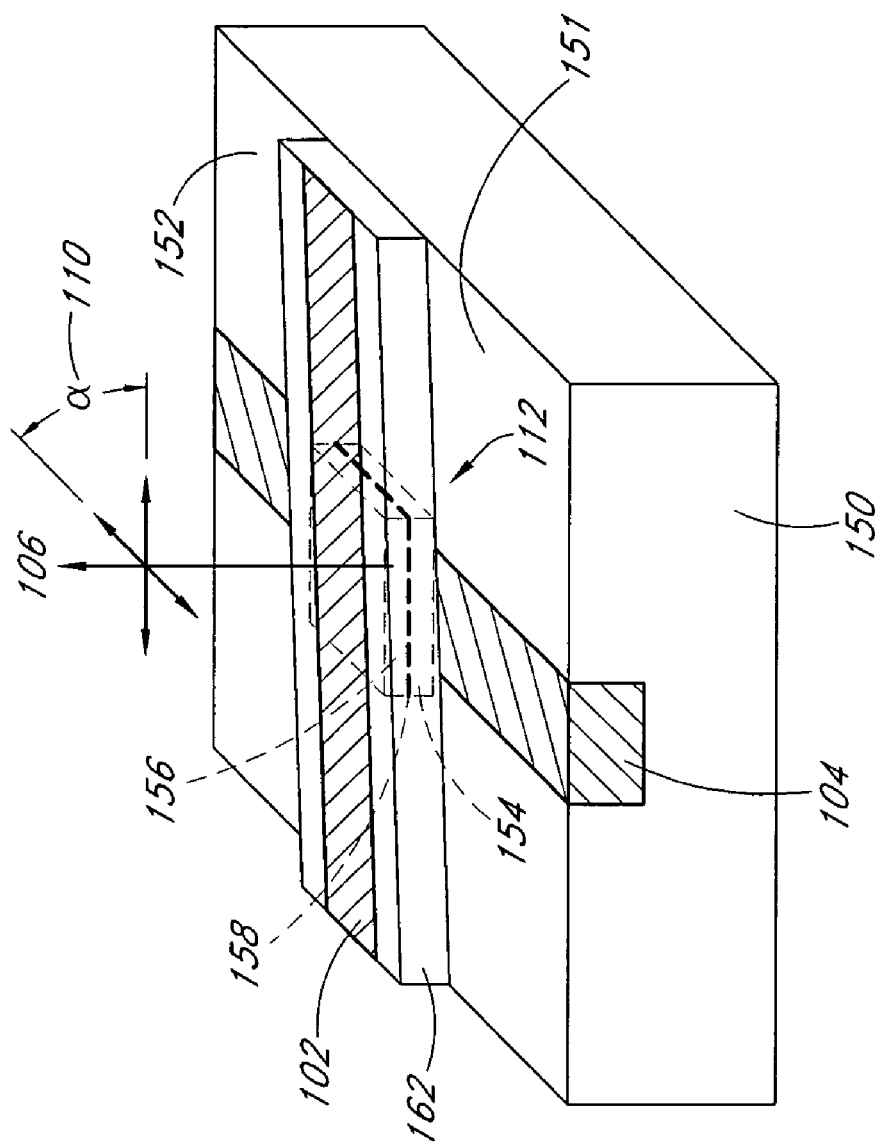
FIG. 3 is a perspective view of a single MRAM cell with row and column lines in one embodiment of a tilted array geometry.

Reference will now be made to the drawings wherein like numerals refer to like parts throughout. FIG. 3 illustrate a single MRAM cell 112 of an array of MRAM cells 112 schematically illustrated in FIG. 4A. As is illustrated in FIG. 3, the MRAM cell 112 is formed on a substrate 150 and two opposing conductors 102 and 104 are formed adjacent the cell 112. In this embodiment, the substrate includes a trench 151 in which the column conductor line 104 is formed. Typically, the column conductor line 104 is formed of copper using well known damascene processing techniques and the substrate 150 is typically an isolation material such as boro-phospho-silicate glass (BPSG).

The cell 112 is then formed on an upper surface 152 of the substrate 150 using known patterning and etching techniques. As is generally understood, the cell 112 typically includes three layers: a magnetic pinned layer 154, a magnetic sense layer 156, and an interposed tunnel layer 158. The magnetic pinned layer 154 in this illustration is electrically connected to the conductor line 104 and the magnetic sense layer 156 is connected to the conductor line 102 in a manner that will be described in greater detail hereinbelow. The operation of the cell 112 is typical to the operation of any of a number of well known MRAM cells and the cell illustrated in FIG. 3 is a simple example of these types of devices.

As is illustrated in FIG. 3, an interlayer dielectric (ILD) 162 is formed on the upper surface 152 of the substrate 150 after formation of the cell 112 using known patterning and etching techniques. The conductor 102 is then formed on the ILD 162 using known techniques and is electrically connected to the sense layer 156 through a via or other known structure. Hence, the cell 112 is positioned between the two conductors 102, 104. The cell 112 is programmed as a result of simultaneous application of current to the two conductors 102, 104.

In particular, the pinned layer 154 of the cell 112 has a fixed magnetic field but the sense layer 156 can be programmed to have one of two magnetic fields such that the electrical resistance through the cell 112 can be varied between two logic states. It will be appreciated from the following description that the structure and formation of the MRAM element 112 can be any of the number of different structures without departing from the spirit of the present invention and the MRAM cell 112 is simply exemplary of one such element.

Figure 4A:
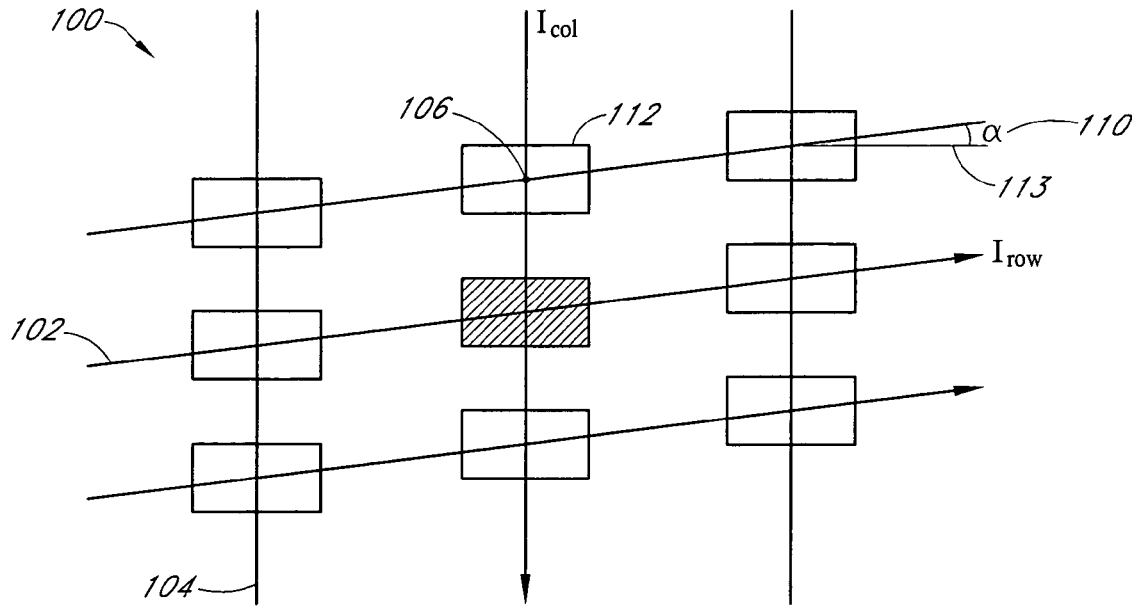
FIG. 4A schematically illustrates one embodiment of a tilted gate array of the present invention.
Figure 4B:
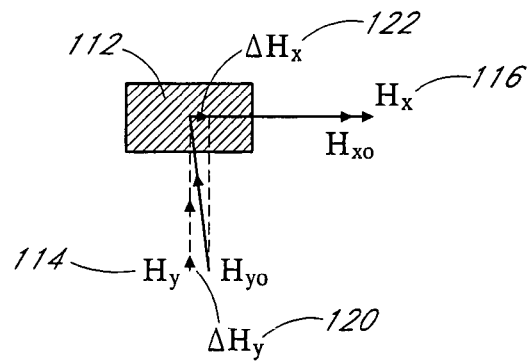
FIG. 4B is a schematic illustration of the magnetic fields resulting from the tilted array geometry of FIG. 4A.

As is illustrated in FIGS. 3, 4A, and 4B, the conductors 102 and 104 intersect in a vertical plane at a point 106. The tilted array geometry 100 results in the intersection being at an angle α 110 from perpendicular.

As shown in FIG. 4A, the tilted array geometry 100 comprises a plurality of mutually parallel row lines 102 and mutually parallel column lines 104 wherein the row lines 102 and column lines 104 intersect at a plurality of intersections 106 at the angle α 110 from perpendicular.

As discussed above, the intersections 106 are adjacent the plurality of MRAM cells 112. In this embodiment, the MRAM cells 112 are elongate structures having a major axis 113. In this embodiment, the row lines 102 are tilted by the angle α 110 from perpendicular with the column lines 104 as well as from the major axis 113 of the MRAM cells 112. During fabrication of the array of cells 112, mask structures are formed so as to offset the row lines 102 from the major axis 113 of the cells 112 by the angle α 110. In the embodiment of the cell 112 illustrated in FIG. 3, this requires the ILD layer 162 and the conductor 102 to be patterned so as to extend in the tilted manner.

By tilting the array of cells by the pre-selected angle α 110, the magnitude of the net magnetic field that is applied to the cells 112 can be increased without increasing the current through the row 102 or column 104 lines. As discussed above, the sense layer 156 is programmed by the application of a magnetic field resulting from current flowing simultaneously through the conductors 102 and 104. Preferably, the sense layer 156 is configured such that current flowing through only one of the conductors 102, 104 is insufficient to switch the magnetic state and, thus, the logic state of the corresponding individual cells 112. However, individual cells 112 of the array can be switched through simultaneous application of a row 102 and column 104 current. Since the row 102 in this embodiment is tilted, the net magnetic force applied to the sense layer 156 is increased.

Specifically, supplying an electrical current to a row line 102 will induce a longitudinal magnetic field $H_y$ 114 and supplying a current to a column line 104 will induce a transverse magnetic field $H_x$ 116 through the MRAM cell 112 adjacent the intersection 106 of the row 102 and column 104 lines. In this embodiment, the tilted row lines 102 induce a lower longitudinal magnetic field $\Delta H_y$ 120 and a higher transverse magnetic field $H_x$ 116 through the MRAM cell 112. In particular, $H_x$ 116 increases by $\Delta H_x$ 122=$H_{yo}$ Sinα and $H_y$ 114 decreases by $\Delta H_y$ 120=$H_{yo}$(1−Cosα) where $H_{xo}$=$H_{yo}$=$H_o$ and where $H_o$ is the transverse and longitudinal magnetic field of an un-tilted array wherein the row and column lines are orthogonal and α is the angle α 110.

As a result of these relationships, an angular value can be selected for the angle α 110 such that it results in greater $\Delta H_x$ 122 than the corresponding $\Delta H_y$ 120. Specifically, for angles α 110 less than 45 degrees, there is a net increase in the total magnetic field applied to the cell 112.

Figure 5:
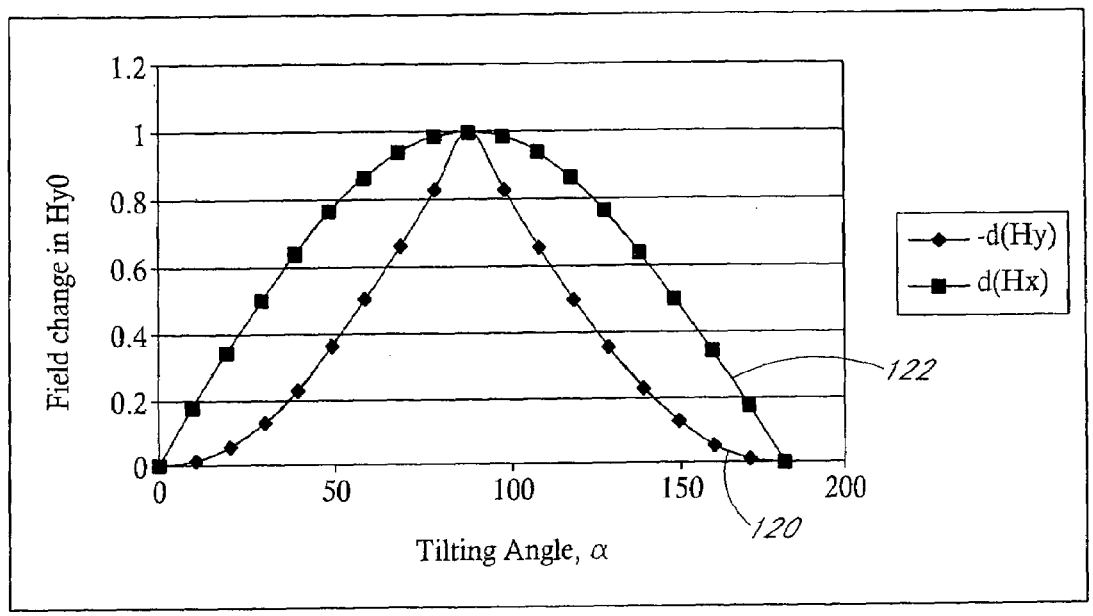
FIG. 5 is a graph of the changes in $H_x$ and $H_y$ for varying tilt angles of the tilted array geometry.

As an example, for an angle α 110 of 5°, $\Delta H_x$ 122=0.09$H_{yo}$ and $\Delta H_y$ 120=−0.004$H_{yo}$. Thus, the increase in $H_x$ 116 is approximately 23 times greater than the decrease in $H_y$ 114 for an angle α 110 of 5° and the net magnetic field is increased. In this embodiment, the increased $H_x$ 116 is aligned with the major axis 113 of the MRAM cells 112 so as to increase the magnetization of the MRAM cells 112 to improve the write performance of the tilted array geometry 100. FIG. 5 illustrates the changes $\Delta H_x$ 122 and $\Delta H_y$ 120 in $H_x$ 116 and $H_y$ 114 for angles α 110 between 0° and 180°. In order to maximize the gain in $H_x$ 116 while minimizing impact on circuit topography, the angle α 110 is preferably maintained around 45 degrees.

Figure 6:
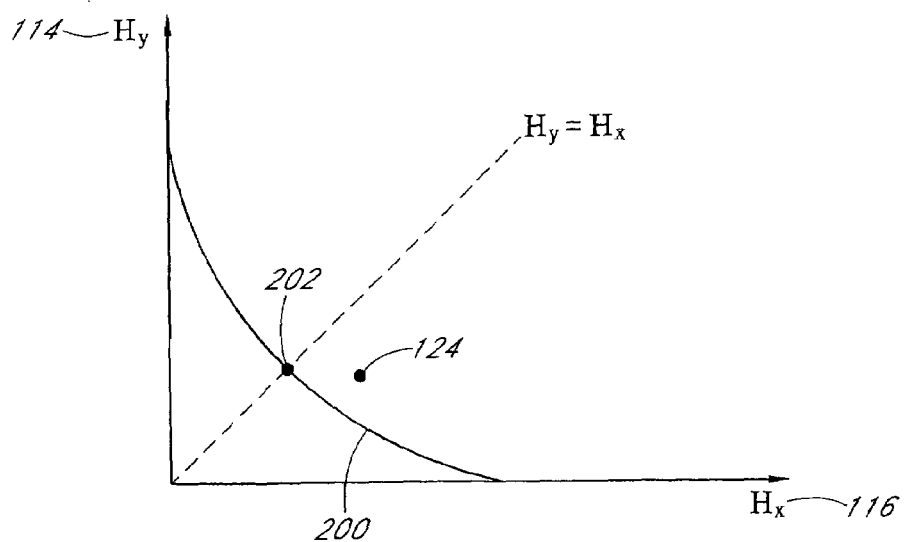
FIG. 6 is a graph illustrating the switching and non-switching zones of a tilted array geometry.

FIG. 6 illustrates the switching/non-switching regions of operation as well as a tilted full-select point 124 for the tilted array geometry 100 as previously described. In particular, the tilted full-select point 124 is further into the switching region and thus provides additional reliability in MRAM cell 112 switching than a non-tilted system. Specifically, the boundary between the switching region and the non-switching region defines the curve 200 in FIG. 6. In the prior art, when the magnitude of the magnetic field components $H_y$ and $H_x$ are approximately the same, the minimum amount of current needed to activate the switch occurs as point 202. However, at this point 202, small variations in the current may result in the MRAM cell 112 not being activated when desired or the cell 112 being unintentionally activated. Consequently, in the prior art, larger amounts of current are typically used to activate the device at a greater cost in power consumption and generated heat.

However, as illustrated in FIG. 6, the full-select point 124 for the tilted array geometry 100 is shifted to the right in the diagram of FIG. 6. As the boundary between the switching region and the non-switching region is decreasing, the full-select activation point 124 is farther from the boundary thereby resulting in more reliable activation of the MRAM cell 112.

In an alternative embodiment, the current in the column lines 104 can be reduced so that $H_x$ 116=$H_{xo}$ and $H_y$ 114 is only slightly less than $H_{yo}$. For the unselected MRAM cells 112 in the corresponding column line 104, this corresponds to shifting the full-select distribution profile to the left in FIG. 6 which also improves the tilted array geometry's 100 write performance in the manner previously described.

It should be noted that the other unselected MRAM cells 112 in the corresponding row line 102 receive only the longitudinal field of $H_o \sin\alpha$ and a transverse field of $H_o \cos\alpha$. This level of magnetic field is generally insufficient to unintentionally switch non-selected MRAM cells 112. For the unselected cells 112 in the selected column line 104, only the longitudinal field $H_o$ is applied and the cells 112 have a minimal chance of being unintentionally switched.

Hence, from the foregoing, it will be appreciated that the tilted array geometry 100 can be used to achieve more reliable activation of the MRAM devices of the array without requiring increased current. While the illustrated embodiments have shown the row line 102 as being tilted, it will be appreciated that the column line 104 could also have been tilted to achieve the same benefit.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A method of forming an array of magnetic random access memory (MRAM) devices, the method comprising:
   forming a first set of substantially mutually parallel conductors;
   forming a plurality of MRAM devices defining a first axis and a perpendicular second axis, each device positioned adjacent a corresponding conductor of the first set of conductors and such that the first axis of each MRAM device is oriented substantially parallel with the corresponding conductor of the first set; and
   forming a second set of substantially mutually parallel conductors positioned such that each MRAM device is adjacent a corresponding conductor of the second set and wherein the second set of conductors are further arranged to extend at an angle α with respect to the second axis of the MRAM devices such that the first and second sets of conductors are arranged asymmetrically with respect to the first and second axes.

2. The method of claim 1, further comprising forming the first set of conductors in an isolating substrate.

3. The method of claim 2, comprising forming the first set of conductors to be arranged adjacent a first side of the MRAM devices and forming the second set of conductors to be arranged adjacent an opposite second side of the MRAM devices such that the MRAM devices are interposed between the first and second sets of conductors.

4. The method of claim 3, further comprising forming a dielectric interlayer around the MRAM devices and between the first and second sets of conductors and electrically interconnecting each MRAM device with the respective conductors in the first and second sets of conductors.

5. The method of claim 1, wherein forming the plurality of MRAM devices comprises:
   forming a substantially permanently magnetic pinned layer in contact with one of a corresponding conductor from the first or second sets of conductors;
   forming a magnetically changeable sense layer in contact with the other corresponding conductor from the first or second set of conductors; and
   forming a tunnel layer interposed between the pinned layer and the sense layer.

6. The method of claim 5, wherein the first and second sets of conductors and the sense layer of corresponding MRAM devices are arranged with respect to each other such that simultaneous application of current to both of the corresponding conductors of the first and second sets generates a combined magnetic field sufficient to change a magnetic state of the sense layer and wherein application of the current to only one of the conductors of the first and second sets is insufficient to change the magnetic state.

7. The method of claim 1, wherein the first and second sets of conductors are arranged with the angle α between 0° and 90°.

8. The method of claim 7, wherein the angle α is approximately 45°.

9. The method of claim 1, comprising forming the plurality of MRAM devices such that the MRAM devices are longer along the second axis than along the first axis.

10. A method of forming column address and row address lines with a magnetic random access memory (MRAM) device, the method comprising:
    forming a column address line to be aligned with and adjacent a magnetic random access memory (MRAM) device; and
    forming a row address line to be aligned with and adjacent the MRAM device wherein the MRAM device defines a first axis and a perpendicular second axis and wherein one of the column address line and the row address line is substantially aligned with the first axis and wherein the other of the column address line and the row address line is offset from alignment with the second axis so as to define an angle therewith.

11. The method of claim 10, comprising forming the column address line to be aligned with the first axis.

12. The method of claim 10, further comprising forming the MRAM device such that a length of the MRAM device along the first axis is shorter than a length of the MRAM device along the second axis.

13. The method of claim 10, further comprising forming the MRAM including:
    forming a substantially permanently magnetic pinned layer adjacent the column address line;
    forming a magnetically changeable sense layer adjacent the row address line; and forming a tunnel layer interposed between the pinned layer and the sense layer.

14. The method of claim 13, wherein the column address line is formed in a trench in a substrate and wherein the column address line and pinned layer are formed such that an electrical connection exists therebetween and wherein the row address line is formed so as to establish an electrical connection with the sense layer and such that a changeable conductivity exists between the column address line and the row address line via the MRAM device depending on the magnetic state of the sense layer.

15. The method of claim 13, wherein the column address and row address lines and the MRAM device are formed such that providing a write current to both the column address and row address lines changes the magnetic state of the sense layer and changes a logic state of the MRAM device.

16. The method of claim 13, wherein sensing the conductivity of the MRAM device between the column address line and the row address line can be used to determine a logic state of the MRAM device.

17. The method of claim 10, wherein the angle is selected such that providing current to both the column address and row address lines results in increased total magnetic field being provided to the MRAM device.

18. The method of claim 17, wherein the angle is selected such that a magnetic field along one of the first and second axes is reduced and such that that a magnetic field along the other of the first and second axes is increased such that the total magnetic field provided to the MRAM device is increased.

19. The method of claim 17, wherein the angle is selected to be approximately 45°.

20. The method of claim 10, further comprising:
forming a plurality of the column address lines such that the plurality of column address lines are substantially mutually parallel;
forming a plurality of the row address lines such that the plurality of row address lines are substantially mutually parallel; and
forming a plurality of the MRAM devices each adjacent intersections of each of the plurality of column and row address lines so as to form an array of the MRAM devices and the column and row address lines.

* * * * *